(12) United States Patent
Briar

(10) Patent No.: US 6,255,143 B1
(45) Date of Patent: Jul. 3, 2001

(54) FLIP CHIP THERMALLY ENHANCED BALL GRID ARRAY

(75) Inventor: John Briar, Singapore (SG)

(73) Assignee: St. Assembly Test Services Pte Ltd., Singapore (SG)

( * ) Notice: Subject to any disclaimer, the term of this patent is extended or adjusted under 35 U.S.C. 154(b) by 0 days.

(21) Appl. No.: 09/366,752

(22) Filed: Aug. 4, 1999

(51) Int. Cl.$^7$ .................................................. H01L 21/44
(52) U.S. Cl. ........................... 438/127; 438/107; 438/118
(58) Field of Search .................................. 438/107, 108, 438/117, 118, 127

(56) References Cited

U.S. PATENT DOCUMENTS

| | | | |
|---|---|---|---|
| 5,169,805 | * 12/1992 | Mok et al. | 438/117 |
| 5,200,362 | * 4/1993 | Lin et al. | 29/841 |
| 5,355,283 | 10/1994 | Marrs et al. | 361/760 |
| 5,583,378 | 12/1996 | Marrs et al. | 257/710 |
| 5,672,548 | * 9/1997 | Culnane et al. | 438/118 |
| 5,817,545 | 10/1998 | Wang et al. | 438/127 |
| 5,863,814 | * 1/1999 | Alcoe et al. | 438/117 |
| 5,866,949 | 2/1999 | Schueller | 257/778 |
| 5,883,430 | 3/1999 | Johnson | 257/706 |
| 5,896,271 | 4/1999 | Jensen et al. | 361/719 |
| 5,898,224 | 4/1999 | Akram | 257/778 |
| 6,069,023 | * 5/2000 | Bernier et al. | 438/107 |
| 6,117,797 | * 9/2000 | Hembree et al. | 438/759 |
| 6,121,070 | * 9/2000 | Akram | 438/108 |

* cited by examiner

Primary Examiner—John F. Niebling
Assistant Examiner—Christopher Lattin
(74) Attorney, Agent, or Firm—George O. Saile; Stephen B. Ackerman

(57) ABSTRACT

A new method is provided for the conduction of heat between a flip-chip and the motherboard and heatsink onto which the flip-chip is mounted. In a flip-chip package of the invention the heatsink is in direct contact with the flex circuit, the contact balls of the flip chip make contact with the flex circuit. The flip-chip is attached and reflow is performed thereby attaching the contact balls to the flex circuit. The flip chip is encased in a molding compound in a one step process procedure that is in accordance with Ser. No. 09/640,534, assigned to a common assignee. The flip-chip is now placed on the motherboard with the contact balls and the underfill facing upwards. The underfill provides direct contact between the flip-chip and the flex circuit/heatsink. This direct contact significantly increases the heat flow between the flip-chip and the heatsink. The top surface of the flip-chip rests, after the flip-chip has been mounted onto the motherboard, on the motherboard thereby providing maximum heat flow between the top of the flip-chip and the motherboard.

11 Claims, 2 Drawing Sheets

FLIP CHIP THERMALLY ENHANCED BALL GRID ARRAY

This application is related to filed on Aug. 17, 2000, Ser. No. 09/640,534, assigned to a common assignee.

BACKGROUND OF THE INVENTION

(1) Field of the Invention

The invention relates to the fabrication of integrated circuit (IC) devices, and more particularly, to a method to enhance the heat flow between flip-chip BGA devices and the motherboard. The method of the invention also reduces the length of the signal paths between the Integrated Circuit device and the package terminal.

(2) Description of the Prior Art

High density interconnect technology frequently leads to the fabrication of multilayer structures in order to connect closely spaced integrated circuits with each other. A single substrate serves as an interconnect medium to which multiple chips are connected thereby forming a device package with high packaging density and dense chip wiring. The metal layers that make up the interconnect network and the via and contact points that establish connections between the interconnect networks are separated by layers of dielectric (such as polyimide) or insulating layers. In the design of the metal interconnects, strict rules must be adhered to in order to avoid problems of package performance and reliability. For instance, the propagation directions of primary signals must typically intersect under 90 degree angles to avoid electrical interference between adjacent lines. It is further required that planarity is maintained throughout the construction of multilayer chip packages for considerations of photolithography and package reliability. Many of the patterned layers within such a structure form the base for subsequent layers and their lack of planarity can therefore have a multiplying effect on overlying layers.

Quad Flat Packages (QFP) have in the past been used to created surface mounted, high pin count integrated packages with various pin configurations. The electrical connections with these packages are typically established by closely spaced leads that are distributed along the four edges of the flat package. This limits the usefulness of the QFP since a high I/O count cannot be accommodated in this manner. To address this problem, the Ball Grid Array (BGA) package has been created whereby the I/O points for the package are distributed not only around the periphery of the package but over the complete bottom of the package. The BGA package can therefore support more I/O points making this a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mils spacings in a regular or staggered pattern.

Where circuit density keeps increasing and device features continue to be reduced in size, the effect of the interconnect metal within the package becomes relatively more important to the package performance. Factors that have a negative impact on circuit performance, such as line resistance, parasitic capacitance, RC delay constants, crosstalk and contact resistance have a significant impact on the package design and its limitations. A significant power drop may for instance be introduced along the power and ground buses where the reduction of the interconnect metal does not match the reduction in device features. Low resistance metals (such as copper) are therefore finding wider application in the design of dense semiconductor packages.

Increased I/O combined with increased high demands for high performance IC's has led to the development of Flip Chip packages. Flip chip technology fabricates bumps (typically Pb/Sn solder) on Al pads and interconnects the bumps directly to the package media, which are usually ceramic or plastic based. The flip-chip is bonded face down to the package through the shortest paths. These technologies can be applied not only to single-chip packaging, but also to higher or integrated levels of packaging in which the packages are larger and to mote sophisticated substrates that accommodate several chips to form larger functional units.

The flip-chip technique, using an area array, has the advantage of achieving the highest density of interconnection to the device and a very low inductance interconnection to the package. However, pre-testability, post-bonding visual inspection, and Coefficient of Thermal Expansion (CTE) matching to avoid solder bump fatigue are still challenges. In mounting several packages together, such as surface mounting a ceramic package to a plastic board, the CTE mismatch can cause a large thermal stress on the solder lead joints that can lead to joint breakage caused by solder fatigue from temperature cycling operations.

Prior Art substrate packaging uses ceramic and plastic BGA packaging. Ceramic substrate packaging is expensive and has proven to limit the performance of the overall package. Recent years have seen the emergence of plastic BGA packaging, this packaging has become the main stream design and is frequently used in high volume BGA package fabrication. The plastic substrate BGA package performs satisfactorily when used for low-density flip-chip IC's. If the number of pins emanating from the IC is high, that is in excess of 350 pins, or if the number of pins coming from the IC is less than 350 but the required overall package size is small, or if the chip power dissipation is high (in excess of 4 Watts per chip), the plastic structure becomes complicated and expensive.

In mounting a large number of flip chip packages, the following aspects are key aspects in the design of the interfaces onto which the flip chip dies are mounted:
- interconnect of the flip-chip contact points to the surrounding electrical components
- thermal transmission between the flip-chip and its environment and
- firmness of the overall package that contains the large number of flip-chips.

Interconnecting of the flip-chip contact points to the surrounding electrical components can be accomplished by mounting the flip chip on the surface of a package substrate or by interconnecting the flip-chip to a circuit type that contains the interconnect lines. The contact points of the flip-chip IC device make contact with contact points in the circuit, the circuit re-distributes (fan-out) the flip-chip IC device to the contact points. The interconnect lines contained within the circuit are connected to contact balls that are mounted on the device or on the motherboard and form the interface between the final package assembly and the motherboard. It must thereby also be understood that the original contact balls of the flip chip IC device are encased in a material (for instance epoxy) for protection of these balls. The epoxy is therefore encased between the lower surface of the flip-chip IC device and the upper surface of the flex circuit. This epoxy is referred to as underfill since it is filled in under the original flip-chip device.

Firmness of the overall package is assured by mounting the flip-chip devices on the surface of a motherboard, the motherboard provides, in addition to electrical interconnects, the rigidity of the overall package.

Thermal transmission between the flip-chip and its environment is assured by providing a heat sink that is typically attached to the flex circuit.

The invention addresses the aspect of thermal transmission between the flip-chip and its environment. The invention teaches a method that provides excellent heat flow properties whereby the heat that is generated in the die is removed from both the top and the bottom surface of the die. The invention further provides for a reduction in the length of the signal path since signals travel directly from the IC device to the circuit contact balls without having to travel through vias or other transmission paths.

U.S. Pat. No. 5,898,224 (Akram) shows a Flip chip assembly with underlayer and a heat sink and an outer top encapsulant.

U.S. Pat. No. 5,883,430 (Johnson) shows a flip chip encapulated on the bottom and sides, a heat sink on top and an underlayer.

U.S. Pat. No. 5,817,545 (Wang et al.) teaches a process for underfill for a flip chip.

U.S. Pat. No. 5,866,949 (Schueller) teaches a BGA process with an encapsulant.

U.S. Pat. No. 5,896,271 (Jensen et al.) recites a flex substrate with a heat sink on top.

U.S. Pat. No. 5,355,283 (Marrs et al.) provides a method of mounting a ball grid array on a substrate in which vias are formed.

U.S. Pat. No. 5,583,378 (Marrs et al.) provides a ball grid array package that includes a thermal conductor which is a linearly co-extensive outer layer of an interconnect substrate and that forms the outer surface of the ball grid array package.

SUMMARY OF THE INVENTION

A principle objective of the invention is to enhance heat flow between a flip-chip and the environment that is provided for the flip-chip.

It is another objective of the invention to reduce the length of the path that electrical signals must travel between the IC device and the package contact balls.

In accordance with the objectives of the invention a new method is provided for the conduction of heat between a flip-chip and the motherboard and heatsink onto which the flip-chip is mounted. In a flip-chip package of the invention the heatsink is in direct contact with the circuit, the contact balls of the flip chip make contact with the circuit. The flip-chip is attached and reflow is performed thereby attaching the contact balls to the flex circuit. The flip chip is encased in an epoxy compound in a one step process that is in accordance with Ser. No. 09/640,534, assigned to a common assignee. The flip-chip is now placed on the motherboard with the contact balls and the underfill facing upwards. The underfill provides direct contact between the flip-chip and the circuit/heatsink. This direct contact significantly increases the heat flow between the flip-chip and the heatsink. The top surface of the flip-chip rests, after the flip-chip has been mounted onto the motherboard, on the motherboard thereby providing maximum heat flow between the top of the flip-chip and the motherboard.

DESCRIPTION OF THE PREFERRED EMBODIMENTS

Figure 1:
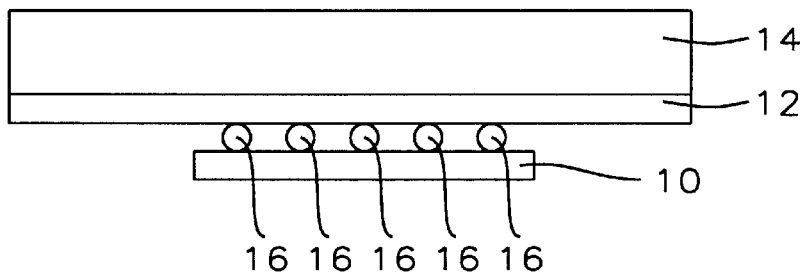
FIG. 1 shows a cross-section of a flip chip that is attached to a flex circuit and its heat sink.

Referring now specifically to FIG. 1, there is shown a cross section of a flip-chip 10 that is mounted on a flex circuit 12 and makes contact with this flex circuit by means of contact balls 16. The flex circuit 12 is in direct physical contact with the heatsink 14; the heatsink 14 is typically made of copper.

The flex circuit 12 can be a Printed Wiring Board (PWB) or other interconnect substitute that can transmit electrical signals.

Figure 2A:
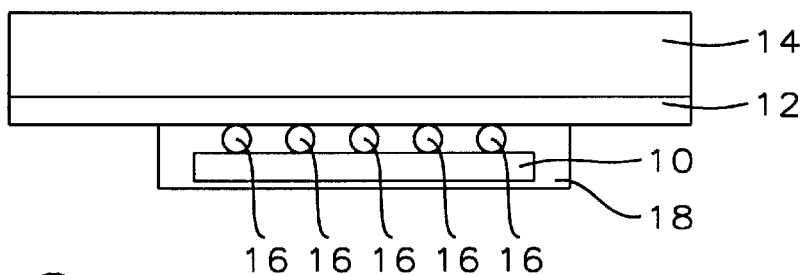
FIG. 2a shows the cross section of FIG. 1 after the flip chip has been encased in a molding in accordance with Ser. No. 09/640,534.

FIG. 2a shows the cross section of FIG. 1 after the flip chip has been encased in a molding in accordance with Ser. No. 09/640,534. FIG. 2a shows a cross section of the flip-chip 10 after the molding compound 18 has been put in place. This molding compound 18 can be an epoxy mold compound. It must be noted that the molding compound 18 is in place not only between the underside of the IC chip 10 and the flex circuit 12 (the underfill) but is also present around the sides of the IC chip 10. This "spill-over" of the mold around the sides of the IC chip is used at a later time to increase the surface of the underfill where this underfill makes contact with the flex circuit. This will become apparent under the description of FIG. 4.

The method of encasing the flip chip in the molding compound 18 is in accordance with Ser. No. 09/640,534, this docket provides a method wherein the Integrated Circuit chip is encased in one processing step including the underfill of the chip. In the invention submitted under Ser. No. 09/640,534, the top surface of the BGA chip is in contact with a heat sink while the bottom surface of the BGA chip (the contact balls) makes electrical contact with a substrate (board) through which the lines of electrical interconnect are spread out. The bottom surface of the substrate under Ser. No. 09/640,534 has contact balls for connection of the overall package to the surrounding circuitry.

Figure 2B:
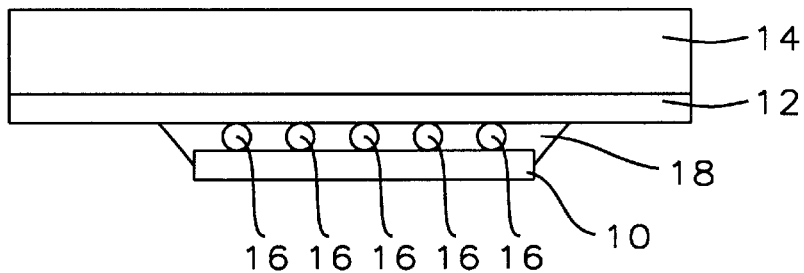
FIG. 2b shows the cross section of FIG. 1 after the flip chip has been attached and underfill has been inserted.

FIG. 2b shows a cross-section of the version of the flip-chip 10 to which underfill 18 has been added. The flex circuit 12 is highlighted, as is the heatsink 14.

Figure 2C:
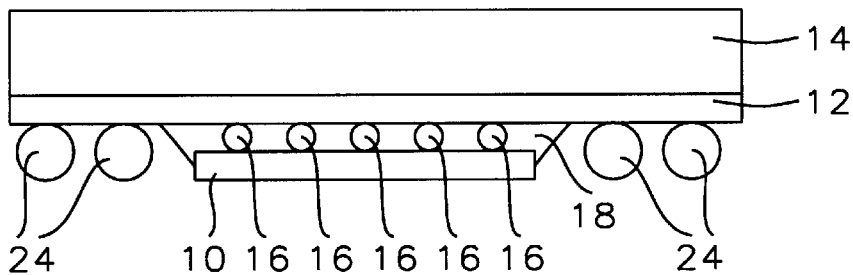
FIG. 2c shows a cross section of the IC device after the flip chip has been attached to the flex circuit and the heat sink assembly, underfill has been inserted and contact balls have been attached.

FIG. 2c shows a cross section of the IC device after the flip-chip 10 has been attached to the flex circuit 12 and to the heat sink assembly 14. Underfill 18 has been added, the contact balls 24 can then be attached and re-flowed to create the final flip-chip BGA device with the die mounted in the downward position (the die-down BGA device).

Figure 3:
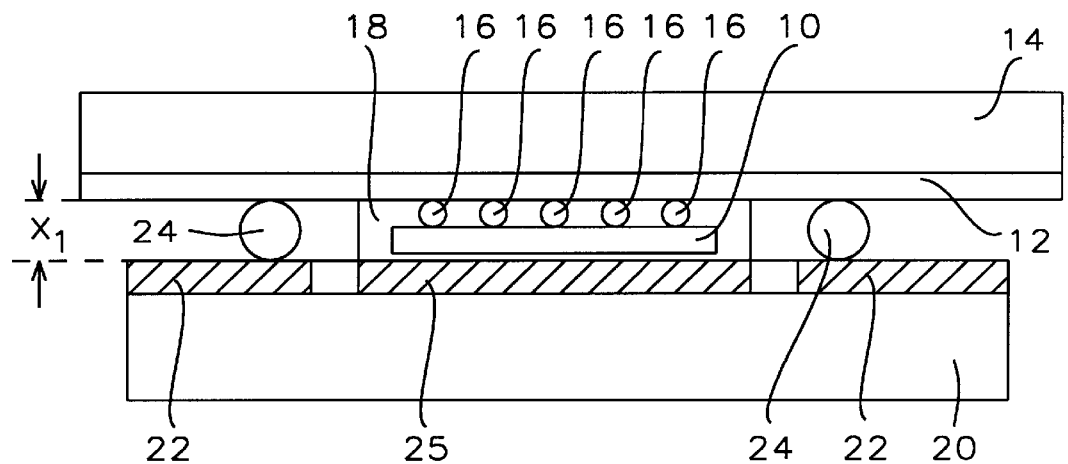
FIG. 3 shows the package of the flip-chip being matched with the motherboard.

FIG. 3 shows a cross section of the flip-chip chip after the flip-chip has been placed on the motherboard 20. A wetting or adhesion enhancer can be deposited over the surface of the motherboard for improved processing results. Layer 22 is typically made using copper or tin/lead or any other electrically conductive material and is provided over the surface of the motherboard to affect the reflow of the contact balls 24 of the motherboard 20. Layer 25 is on the same plane as layer 22 and is normally made of the same copper or tin/lead material but this layer is electrically insulated from layer 22. This allows layer 25 to act as a thermal shield and as an EMI shield. The distance X1 that has been highlighted in FIG. 3 is the distance between the surface of flex circuit 12 and layer 22, this distance is used under the following discussion of FIG. 4.

Figure 4:
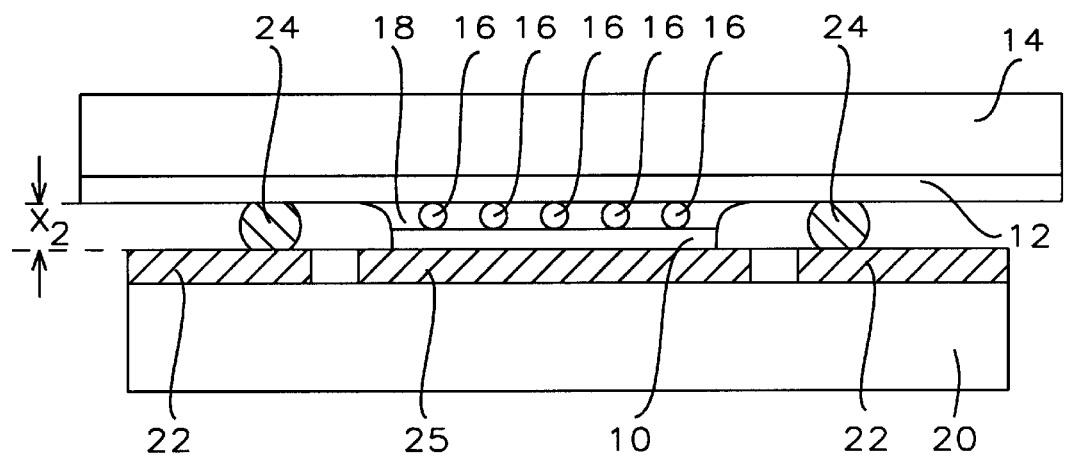
FIG. 4 shows a cross section of the flip-chip mounted on the motherboard after reflow of the underfill of the chip and the motherboard solder balls.

FIG. 4 shows a cross-section after reflow of the motherboard contact balls 24 has been completed. During the process of reflow the contact balls 24 will melt and form a bond with layer 22. During this bonding process the surface 12 will naturally collapse toward layer 22. During this collapse, the distance $X_1$ shown in FIG. 3 will be reduced to a smaller distance $X_2$ and will allow the flip chip IC to come into contact with the layer 25. Since the flip-chip IC is now in direct contact with layer 25, the heat exchange between the flip chip and the motherboard 10 has been increased.

It is further clear from FIG. 4 that the flip-chip is in maximum (possible) physical contact with the motherboard thereby providing for maximum heat interchange between the flip-chip 10 and the motherboard 20. It is further possible to allow the distance $X_1$ and $X_2$ to remain the same after reflow and to therefore prevent the die from forming contact with layer 25.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of packaging Integrated Circuit devices, comprising:

providing an Integrated Circuit device, said IC having been provided with first points of electrical contact;

providing a heat sink, an interconnect substrate for said Integrated Circuit device having been attached to a surface of said heatsink, said interconnect substrate having been provided with second points of electrical contact in a surface thereof;

bringing said heatsink in close contact with said IC device, aligning said first points of electrical contact with said second points of electrical contact;

attaching and reflowing said first and second points of electrical contact, establishing electrical connections between said integrated circuit and said interconnect substrate;

encasing said IC device in a molding compound, including providing underfill for said Integrated Circuit device, said molding compound having a surface; and providing a motherboard, said motherboard having a first surface with third points of electrical contact in addition to having a thermal shield in the surface thereof, said thermal shield having a surface area of about the size of said surface of said molding compound;

depositing a wetting or adhesion enhancer over the surface of said motherboard;

providing contact balls for the motherboard;

placing said contact balls on the surface of said motherboard;

placing said encased IC device on the surface of said motherboard, facing the first points of electrical contact upwards, placing said surface of said molding compound on said thermal shield, at least one of said contact balls for the motherboard establishing electrical contact between at least one of said second points of electrical contact of said interconnect substrate and at least one of said third points of electrical contact of said motherboard; and reflowing said contact balls placed on said motherboard, connecting at least one of said contact balls placed on said motherboard with at least one of said first and second points of electrical contact.

2. The method of claim 1, said heat sink comprising an upper and a lower surface, both surfaces being essentially of equal size, both surfaces being essentially parallel to each other.

3. The method of claim 1, said heatsink being a surface of dimensions that are about equal to dimensions of said heatsink, said surface not being limited by heat dissipating characteristics of a heatsink.

4. The method of claim 1, said interconnect substrate comprising an upper and a lower surface, said upper and lower surfaces being essentially of equal size, said upper and lower surfaces being essentially parallel, said lower surface of said interconnect substrate comprising electrical contact points, said upper surface of said interconnect substrate being electrically insulated.

5. The method of claim 1 wherein said encasing the IC device in a molding compound comprises:

creating a cavity;

inserting said Integrated Circuit device into said cavity; and injecting a molding compound into said cavity.

6. The method of claim 5 wherein said creating a cavity comprises:

creating a first surface parallel with said interconnect substrate;

creating four planer spacer surfaces separating said interconnect substrate from said surface that is parallel with the plane of said interconnect substrate by a measurable amount, said measurable amount being selected such that contact points of said IC device contact said interconnect substrate, a surface of said IC device contacting said first surface that is parallel with the plane of said interconnect substrate; and forming a cubic cavity, said first surface and said interconnect substrate forming opposite walls of said cavity, said four planer spacers forming two sets of two opposing walls of said cavity, two walls of each of these sets of opposing walls having the same geometric dimensions, planes of said heat sink being parallel with said interconnect substrate, two planes of each of the two sets of planar spacers belonging to the same set of parallel planes.

7. The method of claim 6 wherein a cross section of said cavity in a plane that is parallel with the plane of a surface of said heat sink is smaller than a cross section of said heat sink by a measurable amount, a geometric center of said cavity being located on a line through a geometric center of said heat sink, said line being perpendicular to the plane of a surface of said heatsink.

8. The method of claim 1, said contact balls for the motherboard having a diameter essentially the same as a distance between the interconnect substrate and the surface of said molding compound being used for encasing the IC device.

9. The method of claim 1 wherein said motherboard comprises:

an upper surface;

third points of electrical contact in said upper surface, said third points of electrical contact being provided as a means for making electrical contact with said second points of electrical contact of said interconnect substrate; and a network of conducting interconnect lines interconnecting said third points of electrical contact with electrical circuits of which said IC device forms a functional part, said network of conducting interconnect lines being contained in one or more layers within said motherboard.

10. The method of claim 1, said IC device being selected from a group comprising Ball Grid Array (BGA), Land Grid Array (LGA) and Pin Grid Array (PGA), Chip Scale Packaging (CSP) and Quad Flat Pack (QFP) devices.

11. The method of claim 1, said interconnect substrate comprising a first and a second surface, said first and said second surfaces being essentially parallel, said first surface of said interconnect substrate comprising electrical contact points, said second or said first and said second surfaces of said interconnect substrate being electrically connected to said heat sink in at least one first point, further being electrically isolated from said heat sink in at least one second point.

* * * * *